(12) United States Patent
Nakasuji

(10) Patent No.: US 6,525,324 B1
(45) Date of Patent: Feb. 25, 2003

(54) CHARGED-PARTICLE-BEAM PROJECTION OPTICAL SYSTEM

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/204,753

(22) Filed: Dec. 2, 1998

(30) Foreign Application Priority Data

Dec. 3, 1997 (JP) .............................................. 9-347324

(51) Int. Cl.$^7$ .............................................. G03B 27/52
(52) U.S. Cl. .................... 250/398; 250/396 R
(58) Field of Search .................... 313/442; 250/398, 250/396 R, 396 ML

(56) References Cited

U.S. PATENT DOCUMENTS

| | | | | |
|---|---|---|---|---|
| 4,544,847 A | * | 10/1985 | Taylor | 250/396 ML |
| 5,173,582 A | * | 12/1992 | Sakamoto | 219/121.25 |
| 5,260,151 A | | 11/1993 | Berger et al. | |
| 5,770,863 A | * | 6/1998 | Nakasuji | 250/396 R |
| 5,847,402 A | * | 12/1998 | Nakasuji | 250/396 ML |
| 5,912,469 A | * | 6/1999 | Okino | 250/396 R |
| 6,049,084 A | * | 4/2000 | Simizu | 250/396 ML |
| 6,100,688 A | * | 8/2000 | Smith | 324/300 |

FOREIGN PATENT DOCUMENTS

JP  05-160012  6/1993

OTHER PUBLICATIONS

U.S. patent application Ser. No. 09/067,313, Nakasuji, filed Apr. 27, 1998.
Heritage, "Electron–Projection Microfabrication System," *J. Vac. Sci. Technol.* 12:1135–1140 (1975).
Hosokawa, "Systematic Elimination of Third Order Aberrations in Electron Beam Scanning System," *Optik* 56:21–30 (1980).
Ohiwa et al., "Elimination of Third Order Aberrations in Electron Beam Scanning Systems," *Electron Commun. Jpn.* 54:730–737 (1971) (in Japanese with English Abstract).
Pfeiffer et al., "Variable Axis Lens for Electron Beams," *Appl. Phys. Lett* 39:775–776 (1981).

* cited by examiner

Primary Examiner—John R. Lee
Assistant Examiner—Anthony Quash
(74) Attorney, Agent, or Firm—Klarquist Sparkman LLP

(57) ABSTRACT

A charged-particle-beam projection-reduction optical system includes aberration-correcting deflectors positioned between a mask position and a substrate position. At least two of the deflectors are arranged to be excited by a single power source. The at least two deflectors are positioned and structured such that any fluctuations in power supplied by the power source tend to cause offsetting effects in the at least two deflectors such that any such fluctuations will have little or no effect on a position of the image on the substrate. One or more of the deflectors may include a main coil and a sub-coil. The main coil is powered by the single power source, and the sub-coil is powered by another power source.

13 Claims, 2 Drawing Sheets

CHARGED-PARTICLE-BEAM PROJECTION OPTICAL SYSTEM

FIELD OF THE INVENTION

This invention pertains to a charged-particle-beam projection-optical system that transfers a pattern from a mask onto a sensitive substrate (a wafer, etc.) using a charged-particle beam. More specifically, it pertains to a charged-particle-beam projection-optical system that can reduce the demand for stability and low noise in deflector power sources, while still enabling high-precision, high-throughput pattern transfer.

BACKGROUND OF THE INVENTION

Direct-write electron-beam exposure systems provide high-precision, high-resolution image formation, but at low throughput rates. A variety of other electron-beam-based exposure systems have been developed with the goal of improving throughput. Currently, hybrid exposure systems (also referred to as cell-projection systems), character-projection systems, and block exposure systems have each been realized to some degree.

In a hybrid exposure system, small identical patterns (approximately 51 $\mu$m square on the wafer) of a repetitive circuit portion are repeatedly transferred as individual units, using a mask on which multiple instances of the pattern have been formed. In such an exposure system, the non-repetitive portions of basic semiconductor integrated circuit devices (DRAMs, etc.) reduce potential throughput by about one order of magnitude because a long time is required to delineate the non-repetitive portions of a circuit. Furthermore, the hybrid exposure system has virtually no advantages in the production of microprocessors and any other circuits of a less repetitive nature, demand for which has been increasing.

Electron-beam reduction-projection devices have been proposed (e.g., see Japan Kokai Patent Publication No. HEI 5-160012). Such electron-beam projection-exposure systems are intended to provide vastly higher throughput than the hybrid exposure systems, while also being particularly useful for production of microprocessors.

Electron-beam projection-exposure systems irradiate an electron beam onto a mask defining the circuit pattern for one entire semiconductor chip, and reduce and project an image of the pattern in the irradiated area of the mask by means of a two-stage projection lens. It is generally not possible to provide an electron-optical field of sufficient size and quality to transfer the entire mask pattern at once. Accordingly, the field of the optical system may be divided into multiple sub-fields. The sub-field patterns may be sequentially transferred, and the electron-beam optical system may be altered or adjusted for each sub-field so as to maximize the performance of the imaging system for each sub-field individually. The entire circuit pattern is transferred by arraying the various sub-field images so that they are stitched together on the wafer. This is sometimes called a "stitcher" system. The basics of one such system are disclosed, for example, in U.S. Pat. No. 5,260,151.

Symmetric electromagnetic doublet lens systems are commonly known as a lens arrangement providing for good imaging performance with reduced aberrations. A symmetric electromagnetic doublet lens system is one in which (1) the lens structures (pole bore diameter, lens gap) of the two lenses that make up the two-stage projection lens are point-of-similarity symmetric about the entrance pupil (i.e., they are point-symmetric about the entrance pupil or crossover point, but with dimensions on the wafer side of the entrance pupil being reduced by the reduction ratio), (2) the magnetic field polarity of each lens is opposite that of the other lens, and (3) the ampere-turns of the excitation coils of both lenses are the same (see M. B. Heritage, *J. Vac. Sci. Technol.* 12(6):1135–1140 (November/December 1975)). With this arrangement and configuration all aberrations in the $\theta$ direction, distortion, and transverse chromatic aberration are canceled.

Off-axis aberrations may be reduced in electron-beam exposure devices by using axial shift-type electromagnetic lenses, such as MOL and VAL, etc. For MOL (Moving Objective Lens), see H. Ohiwa, et al., *Electron Commun. Jpn* 54-B:44 (1971); for VAL (Variable Axis Lens), see H. C. Pfeiffer et al., Appl. Phys. Lett. 39(9.1):775–776 (November 1981).

Third-order geometric optical aberrations may be eliminated by the use of multiple deflectors in the projection-optical system. See, for example, T. Hosokawa, *Optik* 56(1): 21–30 (1980). (The references mentioned above are hereby incorporated herein by reference.)

In electron-beam projection systems utilizing magnetic deflectors for aberration correction, it has generally been necessary to provide a high-precision power source, with output control accuracy of $10^{-6}$ or greater, for the coil of each deflector. Any drift or ripple in the deflector power source causes the position of the projected image to drift or fluctuate, which causes deterioration in the stitching precision and in the line-width precision in the transferred images.

SUMMARY OF THE INVENTION

A charged-particle-beam projection-reduction optical system according to the present invention includes aberration-correcting deflectors positioned between a mask position and a substrate position, with at least two of the deflectors being arranged to be excited by a single power source.

The at least two deflectors are positioned and structured such that any fluctuations in power supplied by the power source tend to cause offsetting effects in the at least two deflectors, such that any such fluctuations will have little or no effect on the position of the image on the substrate. The at least two deflectors may consist of a pair of deflectors arranged to be point-of-similarity symmetric about a crossover point, with an equal number of turns in the coils of each of the pair of deflectors. Multiple such pairs, each powered by a single power source, may be employed.

One or more of the deflectors, desirably on the mask side of the crossover point, may include a main coil and a sub-coil, with the main coil being powered by a power source shared with one or more other deflectors, and the sub-coil being powered by another power source.

Grouping (or pairing) and balancing the deflectors as taught herein relaxes the requirements on deflector power supplies, thereby reducing the negative effects in the imaging system of deflector-power-supply ripple and drift.

The imaging system is desirably structured so as to allow optimum aberration correction with deflector power being adjustable only in pairs or groups. Alternatively (or in addition), provision of a small sub-coil on one or more of the deflectors preserves some of the flexibility of non-balanced deflectors while still reducing negative effects of power supply variations. In either case, high- or higher-performance imaging can be achieved at less cost.

DETAILED DESCRIPTION

Figure 1:
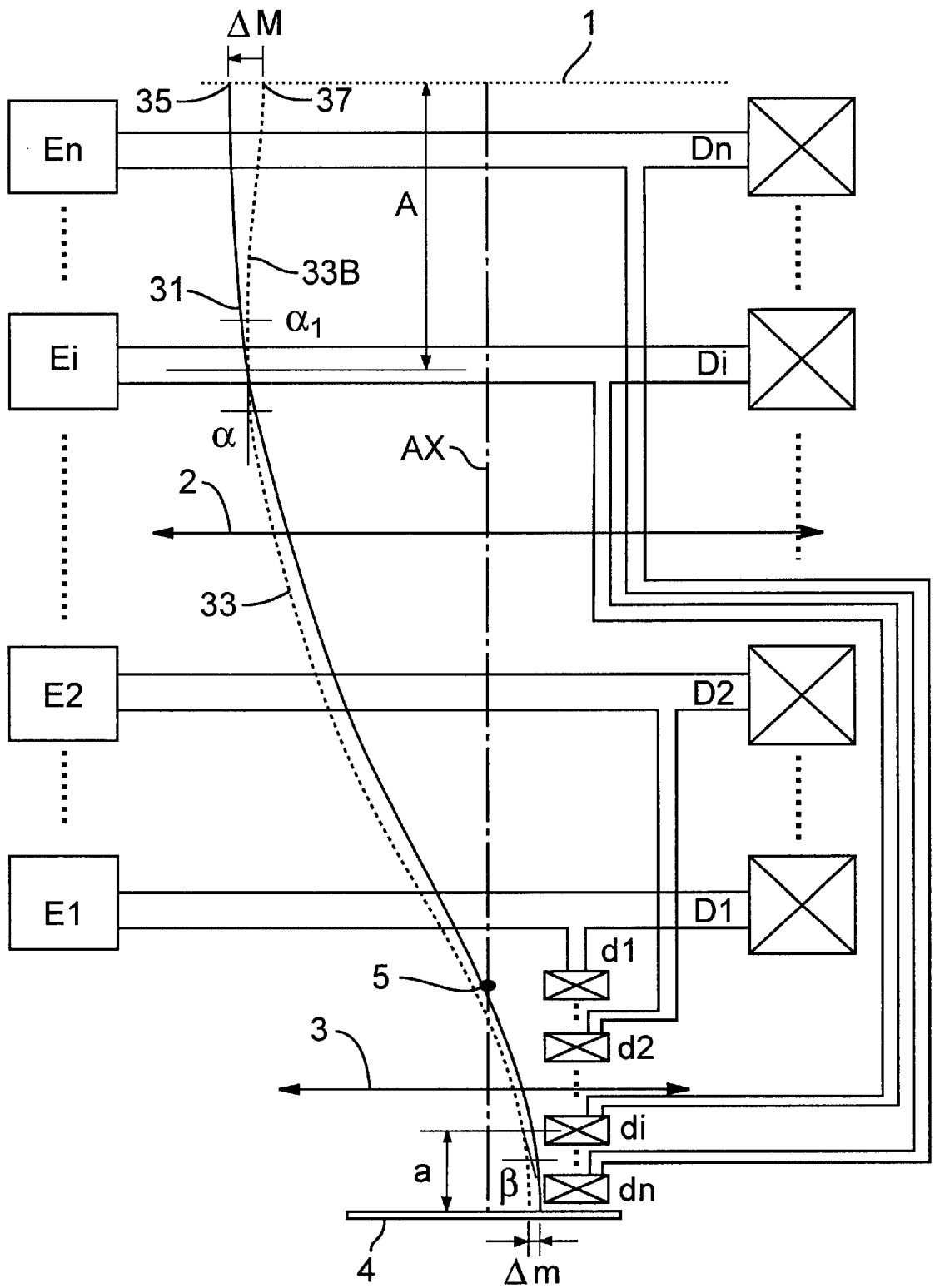
FIG. 1 is a schematic drawing of the mechanical configuration of an example electronbeam projection-optical system according to the invention.

FIG. 1 is a schematic drawing of the mechanical configuration of an example charged-particle-beam ("CPB") projection-optical system of this invention. In the FIG. 1 embodiment, an electron beam is used as an exemplary charged particle beam.

A mask 1, shown at the top of the figure, receives electron-beam irradiation from upstream from an illumination-optical system (not shown). A lens 2, a lens 3, and a wafer (an electron-sensitive substrate) 4 are situated in sequence along the optical axis AX beneath the mask 1, and a patterned electron beam exiting the mask 1 is reduced and transferred to the wafer 4 by the lenses 2 and 3.

A crossover 5 is a point on the axis AX that divides the distance between the mask 1 and the wafer 4 such that the distance from the point to the wafer over the distance from the point to the mask ((distance to wafer)/(distance to mask)) is equal to the reduction (demagnification) ratio.

Aberration-correcting deflectors D1 to Dn, and d1 to dn, are positioned in the projection optical system, with n total deflectors on the mask side and n total deflectors on the wafer side of the crossover 5. The corresponding ith deflectors Di and di are configured and arranged in a point-of-similarity symmetric relationship. In other words, if the space in the area from the crossover 5 to the mask 1 is reduced by the reduction ratio, then the aberration-correcting deflectors D1 to Dn (on the mask 1 side of the crossover 5) are vertically point-symmetric about the crossover 5 with the aberration-correcting deflectors d1 to dn (on the wafer 4 side of the crossover 5). By making the deflectors point-of-similarity symmetric about the crossover 5, the aberrations generated by the deflectors before and after the crossover 5 cancel each other out, and low-aberration performance can be realized.

An example electron-beam path 31 is shown in FIG. 1 by a solid line. The example beam exits the mask 1 nearly perpendicular to the mask 1 (nearly parallel to the optical axis AX) and proceeds downward, where it is directed to the crossover 5 by the lens 2 and the deflectors Di to Dn, and is then transmitted to the wafer 4, in a direction nearly perpendicular to the wafer surface, by the lens 3 and the deflectors di to dn.

Consider a situation in which the output of the drive power source for the ith deflector (deflector coil) Di on the mask side of the crossover 5 has drifted to slightly less than the desired value. In this case, the deflection of a beam at deflector Di is slightly more gentle, such as shown, for example, by the dotted line 33. If we trace the dotted line 33 back through the deflector Di (taking the deflecting field at Di at its ideal, non-reduced strength), we obtain the back-trace 33B. Let the dimensional difference between (1) the intersection 37 of the back-trace 33B with the mask and (2) the exit point 35 of the example beam path 31 be $\Delta M$. Also, let the dimensional difference between the incidence points at the wafer of the beam path 31 and the dotted line 33 be $\Delta m$. There is then a relationship:

$$\Delta m = \Delta M / K \quad (1)$$

between $\Delta M$ and $\Delta m$, wherein K=(reduction ratio)$^{-1}$, i.e., K is the inverse of the reduction ratio (for example, at ¼ reduction, K=4).

If the output of the power source for the ith deflector di on the wafer side of the crossover 5 also drifts to slightly less than the desired value, under the proper conditions the resulting under-deflection of the beam will move the incidence point at the wafer back to the original incidence point, i.e., will move the incidence point by a distance equal to $\Delta m$. The total dimensional variation in the incidence point at the wafer will then be zero.

If the effective distance between the ith deflector Di and the mask is A, and the effective distance between the ith deflector di and the wafer is a, then to cancel the displacement of the point of incidence at the wafer, what is required is a change $\beta$ in the angle of deflection at deflector di such that:

$$a\beta = \Delta m \quad (2)$$

Since the deflection angle produced by the full-strength deflector Di on a beam following path 31 is the same, to a first order approximation, as the deflection angle on a beam following the trajectory formed by backtrace 33B and dotted line 33 (i.e., $\alpha \sim \alpha_1$ in the figure), the change $\alpha$ in the deflection angle at the deflector Di is related to A and the displacement $\Delta M$ by the following:

$$A\alpha = \Delta M \quad (3)$$

If (1) and (3) are substituted into (2), then we obtain:

$$a\beta = A\alpha/K \quad (4)$$

Since a=A/K (given the above-described symmetry of the deflectors Di and di), then $a\beta = \Delta m$, and the total displacement of the incidence point at the wafer is zero, so long as $\alpha = \beta$.

From these results, it is clear that, if the following three conditions are met, positional fluctuations in the mask image will not occur on the wafer, even if variations such as drift, etc., occur in the deflector drive power sources:

(1) Deflectors Di and di are situated at point-of-similarity-symmetric positions about the crossover.

(2) Both deflectors Di and di are excited by the same power source Ei.

(3) The deflection sensitivity (i.e., the change in the deflection angle produced by the deflector) per unit change in current through the deflector is the same in both deflectors Di and di.

These are the basic principles of the CPB projection-optical system of the present invention as shown in FIG. 1.

In order to make the deflection sensitivities in both deflectors Di and di the same, if both deflectors are the same type of electromagnetic deflector, normally it suffices that: (1) the ratio of the inside diameter of the coil in the deflector di to the inside diameter of the coil in the deflector Di is made equal to the reduction ratio, (2) the ratio of the length along the optical axis of the coil of the deflector di to the length along the optical axis of the deflector Di is also made equal to the reduction ratio, and (3) the number of turns in the coils of the deflectors di and Di are made equal to each other.

As noted above, each pair of point-of-similarity symmetrically arranged deflectors (di, Di) is excited using the same power source. As a second aspect of the present invention, the deflector pairs are designed so that they have a number of turns (T) such that a number of ampere-turns (AT) suitable for aberration correction is produced when the same current flows in each deflector of a pair. In other words, the pairs are designed so that aberration correction and adjustments thereto may be performed by adjusting the particular current in each deflector pair as a unit, since each deflector in a pair is excited by the same source.

Each pair of deflectors is excited using the same power source in order to minimize positional fluctuations in the mask image. The same current is thus flowing in each of the deflectors that comprise a pair, and therefore it is desirable to optimize aberration-correction capability by selecting and/or adjusting the number of turns in all deflectors as needed.

According to a third aspect of the present invention, as an alternative or addition to the second aspect described above, the coil of at least one of the deflectors situated between the crossover and the mask is divided into a main coil with a large AT (ampere-turn) number and a sub-coil with a small AT number. The main coil and at least one of the deflector coils situated between the crossover and the wafer (a coil symmetrically paired with the main coil) are excited using the same power source.

According to the above-described second aspect of the invention, the ampere-turns of the deflectors that comprise a pair are always the same. According to this third aspect, in contrast, the coil of at least one deflector on the mask side is divided into two coils: (1) a main coil that is paired and powered together with at least one wafer-side coil, and (2) a smaller sub-coil with an independently adjustable power supply. Thus the ampere-turns in this mask-side deflector can be adjusted to match the transfer conditions by adjusting the current in the sub-coil.

In this third aspect of the invention, since the main coil in the mask-side deflector and the coil(s) in the corresponding wafer-side deflector(s) are excited by the same power source, positional fluctuations in the mask image due to fluctuation or drift of the power source are relatively small. To ensure that such positional fluctuations remain relatively small, it is desirable that the ratio between the number of ampere-turns in the main coil and the number of ampere-turns in the sub-coil in the divided deflectors is in the range of about 5:1 to about 500:1.

The mask-side deflectors are preferably selected for split-coil design because such coils are more easily implemented on the mask side because of the larger dimensions of the mask-side coils.

Figure 2:
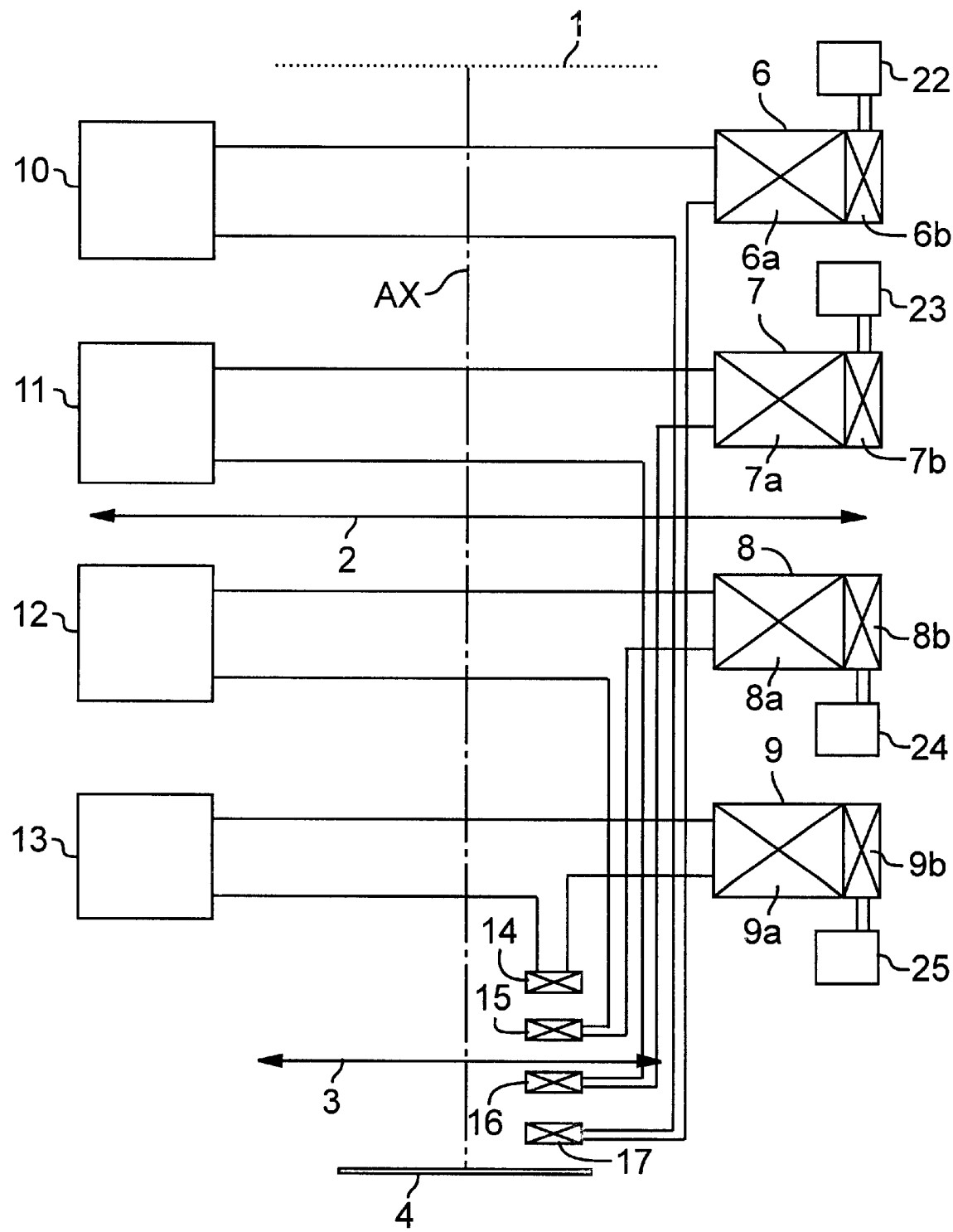
FIG. 2 is schematic drawing of the mechanical configuration of another example electron-beam projection-optical system according to the invention.

FIG. 2 is a schematic diagram of the mechanical configuration of an example CPB projection-optical system according to this third aspect of the present invention. As in FIG. 1, a mask 1, shown at the top of the figure, receives electron-beam irradiation from upstream, from an illumination-optical system (not shown). A lens 2, a lens 3, and a wafer (a charged-particle-sensitive substrate) 4 are situated in sequence along the optical axis AX beneath the mask 1, and a patterned electron beam exiting the mask 1 is reduced and transferred to the wafer 4 by the lenses 2 and 3.

In this projection-optical system, eight deflectors are used to diminish off-axis aberrations. Four deflectors 6–9 are situated on the mask side of the crossover 5, and four deflectors 14–17 are similarly situated on the wafer side of the crossover 5. Of these, pairs of deflectors 6 and 17, 7 and 16, 8 and 15, and 9 and 14 are arranged with point-of-similarity symmetry about the crossover point (not shown).

The four mask-side deflectors 6–9 each have two coils, a main coil 6a–9a respectively, and a sub-coil 6b–9b respectively. Each respective sub-coil 6b–9b is wrapped around the outside of the respective associated main coil 6a–9a. The number of turns of each respective sub-coil 6b–9b is in the range of about 1/5 to about 1/500 of the turns of the respective associated main coil 6a–9a.

The respective main coil 6a–9a of each deflector 6–9 is constructed so as to have the same deflection sensitivity as the respective wafer-side deflector 17–14 with which it is paired. The main coil 6a and deflector 17 are connected in series to and excited by the same power source 10. Similarly, main coil 7a and deflector 16, main coil 8a and deflector 15, and main coil 9a and deflector 14 are likewise each respectively connected in series to and excited by power sources 11, 12, and 13, as shown.

The sub-coils 6b–9b of the mask-side deflectors 6–9 each have the number of turns required to obtain the deflection necessary to diminish aberrations by "fine-tuning" the deflection of respective deflectors. Each respective sub-coil 6b–9b is connected to and excited by a respective individual sub-coil power source 22–25. The current in each sub-coil can thus be varied independently of every other coil, thereby varying the overall deflection-coil current ratio. This allows more precise adjustment of the aberration corrections for each sub-field individually, so as to minimize aberrations anew each time the sub-field is changed.

The ratio between the number of turns in the main coils 6a–9a and the number of turns in the sub-coils 6b–9b and/or the drive currents in the sub-coil power sources 22–25 can be determined based on the results of simulations and/or actual tests.

During design of a system according to the present invention, if it becomes clear from a simulation or actual testing or the like that fluctuation in the current at a specific deflector (coil) has a large effect on image position at the wafer or substrate, then the specific deflector may be excited by a power source shared by another suitable deflector (coil) so as to reduce or cancel the effect. Furthermore, different numbers of deflectors (coils) on the mask side and the wafer side could also be excited by the same power source and balanced against each other. In other words, the balancing need not be done only one-to-one, in pairs, but may also be done, particularly with the aid of simulations and/or testing, in groups of three or more deflectors. The deflectors in such a balanced group are designed such that change in the current through the group produces offsetting changes in deflection, such that little or no change in image position results.

Whereas the invention has been described with reference to particular embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A charged-particle-beam projection-optical system for reducing, projecting, and forming on a sensitive substrate, an image of a charged-particle beam patterned by passing through a mask, the system comprising:

deflectors arranged in one or more pairs, each said pair comprising a first deflector and a second deflector with the first deflector being positioned between a crossover point and a mask location and the second deflector being positioned between the crossover point and a substrate location, the first and second deflectors being arranged so as to be excited by the same power source.

2. The system recited in claim 1 wherein the first and second deflectors are point-of-similarity symmetric about the crossover point.

3. The system recited in claim 1 wherein the first and second deflectors have the same deflection sensitivity.

4. The system recited in claim 2 wherein the one or more pairs are more than one, and wherein the first and second deflectors of each pair are arranged and positioned and provided with numbers of turns so as to facilitate aberration correction by pairwise-adjustment of electric current levels in the deflectors.

5. The system recited in claim 1 wherein the first deflector comprises a main coil and a sub-coil, the main coil being arranged to be excited by the same power source as the second deflector, and the sub-coil being arranged to be excited by another power source.

6. The system recited in claim 5 wherein a number of ampere-turns of the sub-coil is about one-fifth to about one-five-hundredth a number of ampere-turns of the main coil.

7. A charged-particle-beam projection-optical system for reducing, and forming on a substrate, an image of a charged-particle beam patterned by passing through a mask, the system comprising:

a group of deflectors including at least one first deflector on one side of a charged-particle-beam crossover point and at least one second deflector on another side of the crossover point, the group of deflectors being arranged to be excited by the same power source, the group of deflectors being structured and positioned such that a change in a driving current from the power source produces both (1) a change in deflection of a projected charged-particle beam by the at least one first deflector, and (2) an offsetting change in deflection of the projected charged-particle beam by the at least one second deflector.

8. The system recited in claim 7 wherein the at least one first deflector comprises a main coil and sub-coil, the main coil being arranged to be excited by the same power source as the at least one second deflector, and the sub-coil being arranged to be excited by another power source.

9. The system recited in claim 8 wherein a number of ampere-turns of the sub-coil is about one-fifth to about one-five-hundredth a number of ampere-turns of the main coil.

10. A charged-particle-beam projection-optical system for reducing, projecting, and forming on a sensitive substrate, an image of a charged-particle beam patterned by passing through a mask, the system comprising:

deflectors arranged in one or more pairs, each said pair comprising a deflector (Di) and a deflector (di) with the deflector (Di) being positioned between a crossover point and a mask location and the deflector (di) being positioned between the crossover point and a substrate location, the deflector (Di) being point-of-similarity symmetric about the crossover point with the deflector (di), the deflector (Di) being arranged to be excited by a power source, the deflector (di) likewise being arranged to be excited by said power source, the deflectors (Di) and (di) being so structured that a unit change in a current supplied to the deflectors (Di) and (di) by the power source causes a change in a deflection produced by the deflector (Di) and causes an approximately equal and offsetting change in a deflection produced by the deflector (di), such that changes in the current supplied produce little or no change in a location on the substrate of a pattern image projected on the substrate by the charged-particle beam.

11. The system recited in claim 10 wherein the deflectors (Di) and (di) are electromagnetic deflectors of the same type and wherein (1) a ratio of an inside diameter of a coil of the deflector (di) to an inside diameter of a coil of the deflector (Di) is made equal to a reduction ratio by which the pattern to be projected is to be reduced, (2) the ratio of a length along the optical axis of the coil of the deflector (di) to a length along the optical axis of the deflector (Di) is also made equal to the reduction ratio, and (3) the number of coil turns in the deflectors (di) and (Di) are equal.

12. A charged-particle-beam projection-optical system for reducing, projecting, and forming on a sensitive substrate, an image of a charged-particle beam patterned by passing through a mask, the system comprising:

a magnetic lens system for receiving a charged-particle beam patterned by passing through a mask and for projecting a reduced image of the patterned charged-particle beam onto a substrate;

a group of deflectors for causing deflections of the patterned charged-particle beam in the magnetic lens system so as to reduce aberrations of the magnetic lens system;

a power source for exciting the group of deflectors, the group of deflectors connected in series to the power source to receive an excitation current therefrom; and the group of deflectors being structured and positioned such that a change in the excitation current to the group of deflectors from the power source produces mutually offsetting changes in the deflections produced by the group of deflectors, so as to maintain a position of the reduced image on the substrate despite said change in said excitation current.

13. A method for reducing, projecting, and forming on a sensitive substrate, an image of a charged-particle beam patterned by passing through a mask, the method comprising:

providing aberration-correcting deflectors between a mask position and a substrate position, at least two of said deflectors being positioned and structured such that when said at least two deflectors are excited by the same power source, any fluctuations in power supplied to said at least two deflectors tend to cause offsetting effects in said at least two deflectors such that said any fluctuations will have little or no effect on a position of the image on the substrate;

exciting said at least two deflectors by a single power source;

irradiating a mask at said mask position with a charged-particle beam so as to pattern said charged-particle beam; and forming on a substrate at said substrate position an image of the patterned charged-particle beam.

* * * * *

UNITED STATES PATENT AND TRADEMARK OFFICE
CERTIFICATE OF CORRECTION

PATENT NO.    : 6,525,324 B1
DATED         : February 25, 2003
INVENTOR(S)   : Mamoru Nakasuji It is certified that error appears in the above-identified patent and that said Letters Patent is hereby corrected as shown below:

Column 1,
Line 25, "51 $\mu$m" should be -- 5 $\mu$m --.

Column 2,
Line 66, "electronbeam" should be -- electron-beam --.

Column 4,
Line 22, "$\alpha \sim \alpha_1$" should be -- $\alpha \approx \alpha_1$ --.

Signed and Sealed this

Twentieth Day of January, 2004

JON W. DUDAS
*Acting Director of the United States Patent and Trademark Office*